United States Patent
Nakahara et al.

(10) Patent No.: US 7,088,126 B2
(45) Date of Patent: Aug. 8, 2006

(54) OUTPUT CIRCUIT

(75) Inventors: Akihiro Nakahara, Kanagawa (JP); Osamu Souma, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 92 days.

(21) Appl. No.: 10/967,248

(22) Filed: Oct. 19, 2004

(65) Prior Publication Data
US 2005/0134315 A1 Jun. 23, 2005

(30) Foreign Application Priority Data
Oct. 24, 2003 (JP) ............................. 2003-364456

(51) Int. Cl.
*H03K 17/16* (2006.01)
*H03K 19/003* (2006.01)
*H03K 19/094* (2006.01)
*H03K 19/0175* (2006.01)

(52) U.S. Cl. ............................ 326/26; 326/30; 326/31; 326/82; 326/83; 326/84; 326/86; 326/87; 326/88

(58) Field of Classification Search .................. 326/26, 326/30, 31, 82–88
See application file for complete search history.

(56) References Cited

U.S. PATENT DOCUMENTS

| 5,576,635 | A | * | 11/1996 | Partovi et al. ................. 326/27 |
| 5,917,348 | A | * | 6/1999 | Chow .......................... 327/108 |
| 5,926,056 | A | * | 7/1999 | Morris et al. ................. 327/333 |
| 5,933,027 | A | * | 8/1999 | Morris et al. .................. 326/81 |
| 5,966,026 | A | * | 10/1999 | Partovi et al. ................. 326/27 |

FOREIGN PATENT DOCUMENTS

| EP | 0 039 952 | 11/1981 |
| JP | 3-198421 | 8/1991 |
| WO | WO 00/27032 | 5/2000 |

* cited by examiner

*Primary Examiner*—Rexford Barnie
*Assistant Examiner*—Dylan White
(74) *Attorney, Agent, or Firm*—Young & Thompson

(57) ABSTRACT

An output circuit includes a source follower constituted by a n-channel MOS transistor, having a drain connected to a power source and a source connected to an output terminal, and applying an output voltage to a load through the output terminal when a gate is charged, a voltage detector determining if the output voltage is at a first voltage or at a second voltage level, a first discharge circuit discharging the gate of the source follower according to an inputted turn-off signal when the output voltage is at the first voltage level, and stopping discharging the gate of the source follower when the output voltage decreases to the second voltage level and a second discharge circuit discharging the gate of the source follower more gradually than the first discharge circuit does according to the turn-off signal when the output voltage decreases from the first voltage to the second voltage level.

11 Claims, 9 Drawing Sheets

RELATED ART

RELATED ART

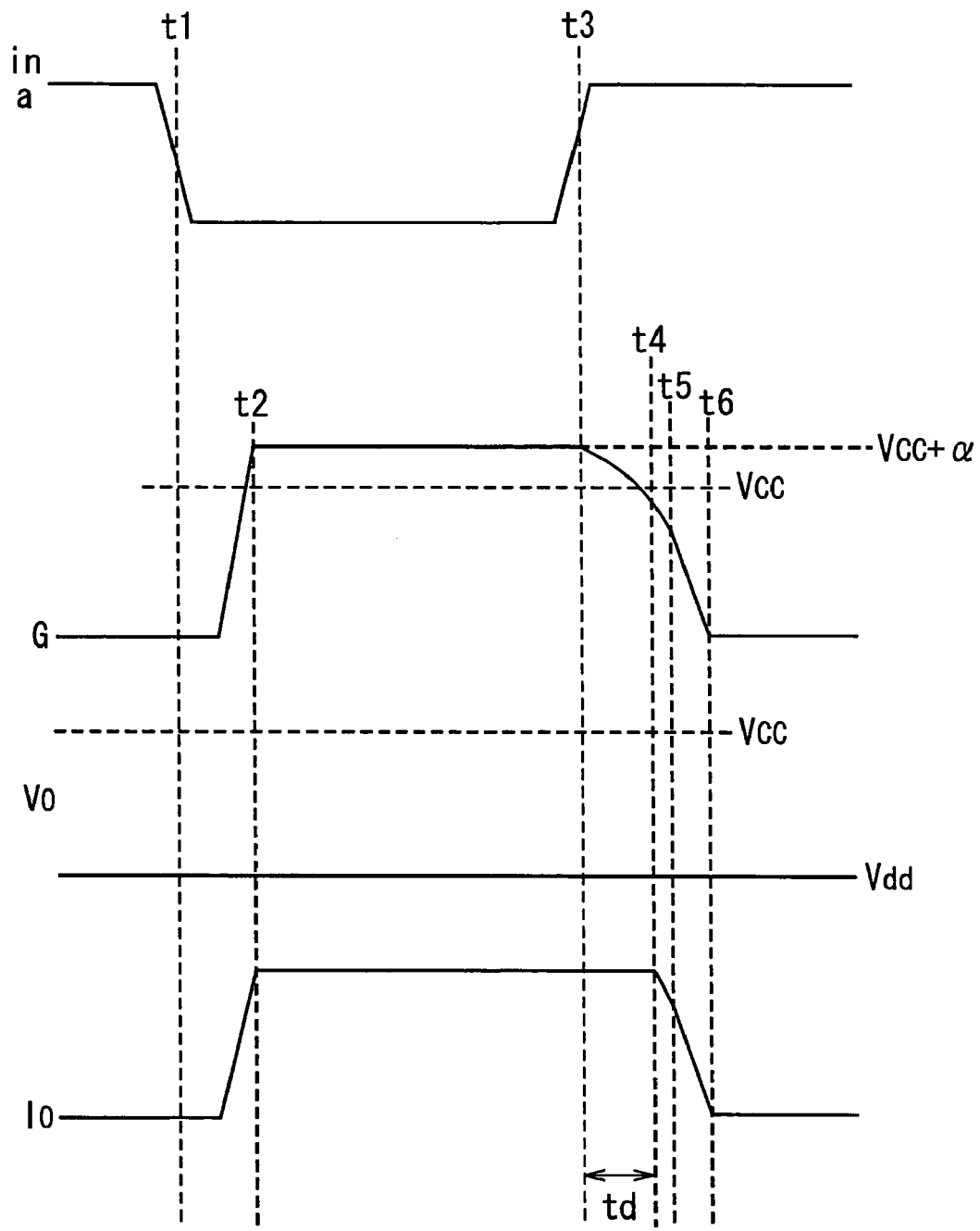

OUTPUT CIRCUIT

BACKGROUND OF THE INVENTION

1. Field of the Invention

The present invention relates to output circuits and, particularly, to an output circuit suitable for use to quickly turn off an output voltage of a source follower constituted by a n-channel MOS transistor (nMOS).

2. Description of Related Art

In output circuits, a source follower constituted by nMOS is used as a high-side switch in some cases. The source follower is turned on if its gate is supplied with a voltage equal to or higher than a supply voltage Vcc plus a gate threshold voltage $\alpha$. The source follower, on the other hand, is turned off if the gate is discharged completely. In order to quickly turn off the source follower, it is necessary to use a discharge circuit for discharging the gate at high speed. Further, when the source follower is used for a power switch for car, for example, a distance between a control circuit of the power switch and a load is relatively long. This can cause a voltage difference between a ground level of the control circuit of the power switch and the ground level of the load. Thus, a discharge circuit to short the gate and source of the source follower is needed to completely turn off the source follower.

FIG. 6 shows an example of a conventional output circuit. The output circuit is composed of a gate driver circuit 1, source follower 2, discharge circuit 3, and discharge circuit 4. The gate driver circuit 1 generates control signals "a" and "b" according to an input signal "in". The source follower 2 is constituted by an enhancement nMOS. It is turned on if the control signal "b" is applied to its gate while a first supply voltage Vcc is applied to its drain to supply an output voltage Vo to a load, which is not shown, through its source.

The discharge circuit 3 is composed of a current limiter 5 and an enhancement nMOS 6. The drain of the nMOS 6 is connected to the gate of the source follower 2 via the current limiter 5. The nMOS 6 is turned on if the control signal "a" is applied to its gate while a second supply voltage Vdd is applied to its source. The current limiter 5 is constituted by a resistor and so on to limit the current of the nMOS 6. The discharge circuit 4 is constituted by an enhancement nMOS. The drain of the discharge circuit 4 is connected to the gate of the source follower 2, and the source is connected to the source of the source follower 2. The nMOS of the discharge circuit 4 is turned on if the control signal "a" is applied to its gate.

FIG. 7 is a time chart to explain the operation of the circuit of FIG. 6. The vertical axis represents voltage, and the horizontal axis represents time. The operation of the output circuit is explained below with reference to FIG. 7.

At t1, the input signal "in" and the control signal "a" change from high (for example, a first supply voltage Vcc) to low (for example, a second supply voltage Vdd), and the control signal "b" changes from low to Vcc+$\alpha$, where $\alpha$ is a gate threshold voltage of the source follower 2, for example, and a voltage increase to turn on the source follower 2. At t2, a gate voltage G of the source follower 2 changes from low to Vcc+$\alpha$. The source follower 2 is thereby turned on to output an output voltage Vo, which is close to the first supply voltage Vcc, through its source. The discharge circuit (nMOS) 4 is thereby turned off. The nMOS 6 of the discharge circuit 3 is also off.

At t3, the input signal "in" and the control signal "a" change from low to high, and the side of the gate control circuit 1 for outputting the control signal "b" is at high impedance. The nMOS 6 of the discharge circuit 3 is turned on, and the gate of the source follower 2 is discharged through the current limiter 5 and the nMOS 6. At t4, after a delay time td from t3, when the gate voltage G of the source follower 2 decreases to the same level as the first supply voltage Vcc, the output voltage Vo starts decreasing. Then, at t5, when the output voltage Vo reaches a level of the first supply voltage Vcc minus the gate threshold voltage h of the discharge circuit (nMOS) 4, the discharge circuit 4 is turned on. The gate of the source follower 2 is thereby discharged also through the discharge circuit 4. At t6, the discharge is completed and the gate voltage G decreases to low, and the output voltage Vo thereby becomes low. An output current Io changes in the same way as the output voltage Vo.

A conventional power switch for car generally has the configuration shown in FIG. 8. The power switch 10 is composed of an input terminal 11, gate driver circuit 12, source follower 13, and output terminal 14. The power switch 10 is configured to receive the first supply voltage Vcc and the second supply voltage Vdd, and actively uses the second supply voltage Vdd.

Recently, it is often required to configure an output circuit in a package with a small number of pins to reduce the package size. In such a case, a power switch having the configuration shown in FIG. 9 is used. The power switch 10A is configured to receive the first supply voltage Vcc only and have an input terminal 11 connected to an external device 20. The external device 20 includes a control terminal 21 and a nMOS 22. In the power switch 10A, the source follower 13 is turned on if a control signal is inputted to the control terminal 21 to turn on the nMOS 22, and the input terminal 11 thereby changes to low (the second supply voltage Vdd). The second supply voltage Vdd is then applied to the power switch 10A via the input terminal 11.

Another example of output circuit of this kind is introduced in Japanese Unexamined Patent Application Publication No. 03-198421. This output circuit has a switch circuit shorting the gate and source of the source follower as a circuit to keep the source follower off. Thus, the source follower is not turned on even if a negative voltage is applied to the output terminal.

However, the above conventional output circuits have the following problems.

In the output circuit of FIG. 6, the gate of the source follower 2 is discharged through the discharge circuit 3 from t3 when the control signal "a" changes from low to high to t5 when the discharge circuit (nMOS) 4 is turned on. Since the discharge is slow in this time period, the delay time td from t3 to t4 when the output voltage Vo starts decreasing is long. This causes the problem that the output circuit cannot meet the requirement of high-speed switching of the source follower 2. On the other hand, too rapid switching causes noise on the first supply voltage Vcc. Hence, it is necessary to turn off the switch follower 2 so that the output voltage Vo decreases relatively gradually. Further, since the discharge circuit 3 is connected to the ground, it requires a package with a large number of pins. This causes that the output circuit is not applicable to the power switch with the configuration shown in FIG. 9.

Furthermore, if a short circuit occurs in the load for some reason, the output voltage Vo is kept at Vdd (the second supply voltage) as shown in FIG. 10. In this case, an excessively large current flows in the source follower 2, which can break down the source follower 2. It is therefore preferred to shorten the delay time td.

Further, in the power switch 10A shown in FIG. 9, when the nMOS 22 of the external device 20 is off, the second supply voltage Vdd is not applied to the power switch 10A. It is thus necessary to configure the output circuit which does not require the second supply voltage Vdd while the source follower 2 is off.

Furthermore, the output circuit described in Japanese Unexamined Patent Application Publication No. 03-198421 has the problem that the source follower is turned off so quickly that noise can occur on the supply voltage.

SUMMARY OF THE INVENTION

According to the embodiments of this invention, an output circuit comprises a source follower constituted by a n-channel MOS transistor, having a drain connected to a power source and a source connected to an output terminal, and applying an output voltage to a load through the output terminal when a gate is charged according to an inputted turn-on signal, a voltage detector determining if the output voltage is at a first voltage level substantially the same as a voltage level of the power source or at a second voltage level lower than the first voltage level, a first discharge circuit discharging the gate of the source follower according to an inputted turn-off signal when the output voltage is at the first voltage level, and stopping discharging the gate of the source follower when the output voltage decreases from the first voltage level to the second voltage level and a second discharge circuit discharging the gate of the source, follower more gradually than the first discharge circuit does according to the turn-off signal when the output voltage decreases from the first voltage level to the second voltage level.

According to this invention, when the output voltage is at the first voltage level substantially the same as a supply voltage, the first discharge circuit discharges the gate of the source follower based on a turn-off signal. After the output voltage decreases to the second voltage level, the second discharge circuit discharges the gate of the source follower more gradually than the first discharge circuit does. It is thereby possible to shorten a delay time from input of a turn-off signal to a change in the output voltage and avoid sharp drop of the output voltage when turning off the source follower, which prevents noise from occurring on the supply voltage. Further, since the first and second discharge circuits are connected between the gate and source of the source follower, there is no need for other supply voltages such as ground when discharging the gate of the source follower. It is thereby possible to apply the output circuit of this invention to a power switch to which no other supply voltage is applied. Furthermore, since the second discharge circuit has a depression nMOS which is turned on according to a turn-off signal, it is possible to prevent the discharge of the gate of the source follower to be discontinued undesirably. In addition, since the gate of the source follower is discharged at a constant current by a constant current device to allow the output voltage to decrease relatively gradually, the output voltage does not drop sharply, thereby preventing noise on the supply voltage.

BRIEF DESCRIPTION OF THE DRAWINGS

The objects, advantages and features of the present invention will be more apparent from the following description taken in conjunction with the accompanying drawings, in which:

FIG. 10 is another time chart to explain the operation of the output circuit of FIG. 6.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiment 1

Figure 1:
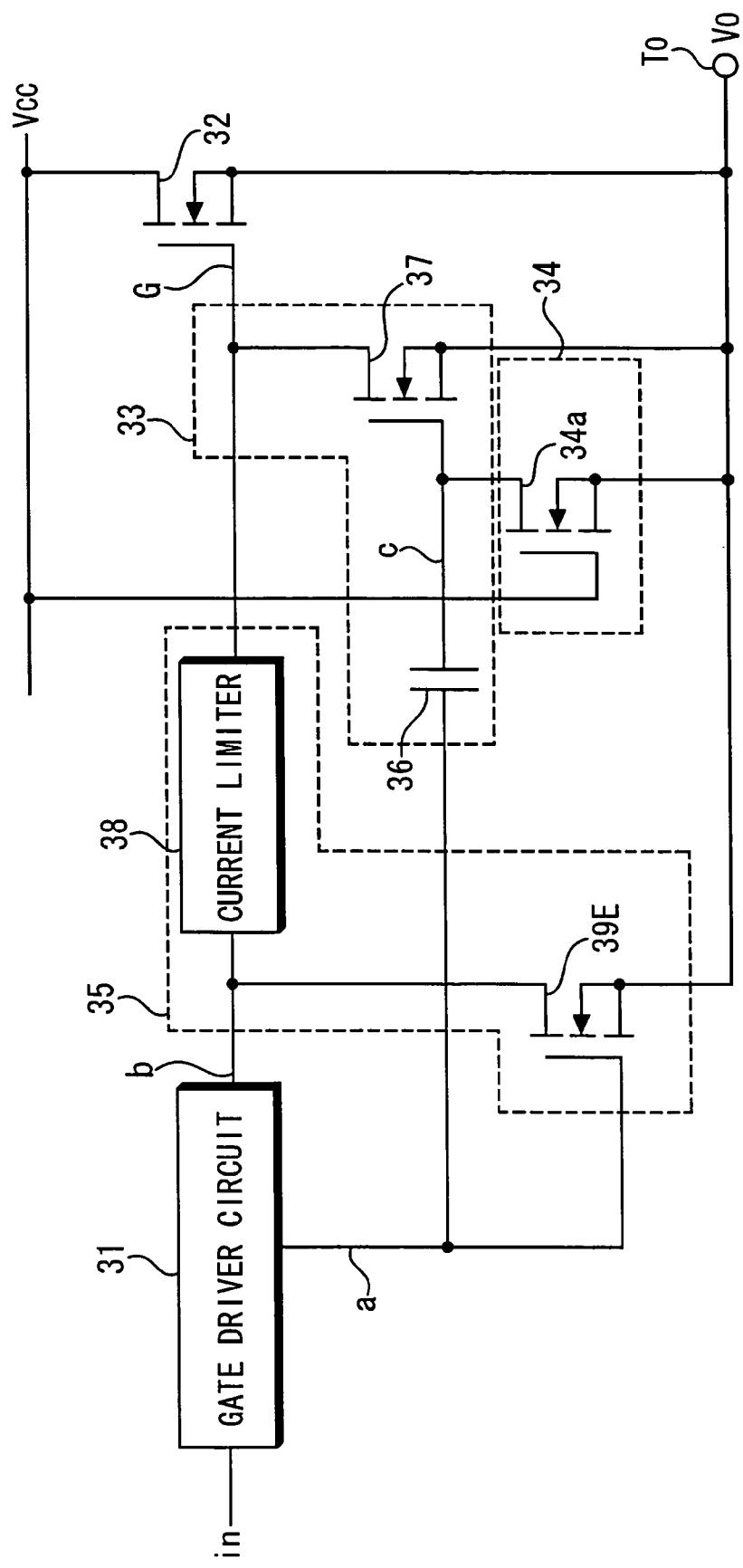
FIG. 1 is a circuit diagram showing an electric configuration of an output circuit according to the first embodiment of the invention.

FIG. 1 is a circuit diagram showing an electric configuration of an output circuit according to the first embodiment of the invention. The output circuit is composed of a gate driver circuit 31, source follower 32, discharge circuit 33, voltage detector 34, and discharge circuit 35. The gate driver circuit 31 is composed of a plurality of transistors and logic circuits and generates control signals "a" and "b" according to an input signal "in". The source follower 32 is constituted by an enhancement nMOS. The drain of the nMOS of the source follower 32 is connected to a power source (supply voltage Vcc), and the source of the same is connected to an output terminal To. When the gate of the source follower 32 is charged by a control signal "b", the output circuit applies an output voltage Vo to a load, which is not shown, through the output terminal To. The voltage detector 34 is constituted by an enhancement nMOS 34a and determines if the output voltage Vo is at the first voltage level substantially the same as the voltage level of the power source (supply voltage Vcc) or it is at a second voltage level lower than the first voltage level. In this embodiment, when the output voltage Vo reaches the second voltage level lower than the supply voltage Vcc at least by the amount of the gate threshold voltage of the nMOS 34a, the nMOS 34a is turned on. The voltage detector 34 thereby stops the operation of the discharge circuit 33.

The discharge circuit is composed of a capacitor 36 and an enhancement nMOS 37. The discharge circuit 33 discharges the gate of the source follower 33 according to a turn-off signal (control signal "a") when the output voltage Vo is at the first voltage level, and stops the discharge of the gate of the source follower 32 when the output voltage Vo decreases from the first voltage level to the second voltage level. In this embodiment, the capacitor 36 is charged with the output voltage Vo when the control signal "a" is lowl and the source follower 32 outputs the output voltage Vo. The output voltage is supplied to the capacitor 36 via a diode connected between the source of the nMOS 34a and the drain of the nMOS 34a in such a way that the drain side is cathode. The capacitor 36 then adds the output voltage Vo to the control signal "a" to generate a control signal "c". Thus, the capacitor 36 is connected to the gate of the nMOS 37 and constitutes a bootstrap circuit which starts the discharge of the gate of the source follower 32 earlier than the discharge circuit 35 does. The nMOS 37 is turned on or off by the control signal "c" applied to the gate. In this embodiment, the nMOS 37 discharges the gate of the source follower 32 based on a turn-off signal (control signal "c") to turn the source follower 32 from on to off when the output voltage Vo is substantially the same as the supply voltage Vcc.

The discharge circuit 35 is composed of a current limiter 38 and an enhancement nMOS 39E. The drain of the nMOS 39E is connected to the gate of the source follower 32 via the current limiter 38, and the source of the nMOS 39E is connected to the source of the source follower 32. The nMOS 39E is turned on or off by the control signal "a" applied to its gate. The current limiter 38 is constituted by a resistor, for example, and it limits the current of the nMOS 39E. The nMOS 39E thereby discharges the gate of the source follower 32 more gradually than the nMOS 37 does based on the turn-off signal (control signal "a") when the output voltage Vo decreases to a level lower than the supply voltage Vcc by the amount of the gate threshold voltage of the nMOS 39E. Thus, the discharge circuit 35 discharges the gate of the source follower 32 more gradually than the discharge circuit 33 does based on the turn-off signal (control signal "a") when the output voltage Vo decreases from the first voltage level to the second voltage level. In this embodiment, the gate threshold voltage of the nMOS 39E is set to a level equal to or lower than the gate threshold voltage of the nMOS 34a.

Figure 2:
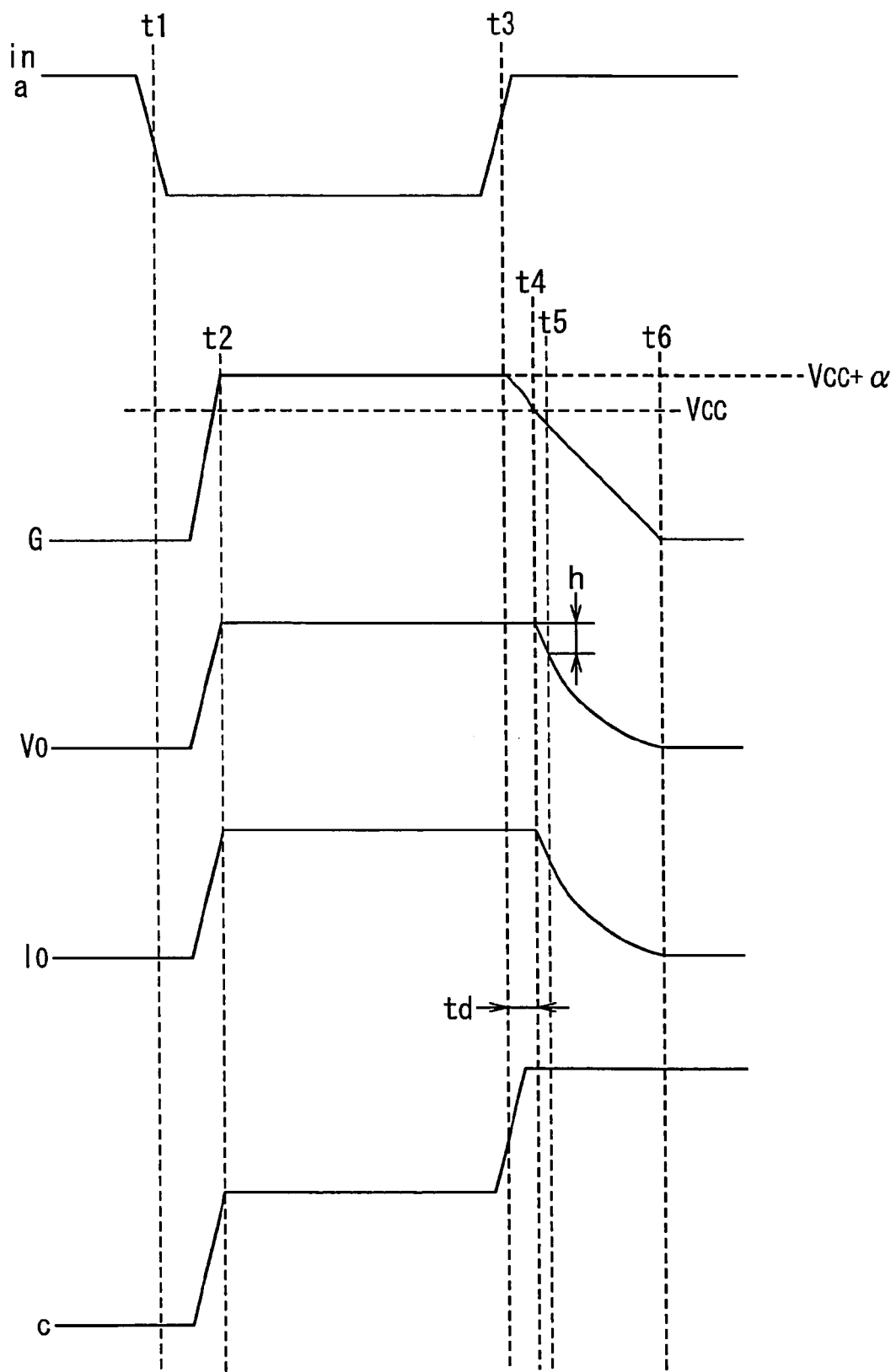
FIG. 2 is a time chart to explain the operation of the output circuit of FIG. 1.

FIG. 2 is a time chart to explain the operation of the output circuit of FIG. 1. The vertical axis represents voltage, and the horizontal axis represents time. The operation of the output circuit of this embodiment is explained below with reference to FIG. 2.

At t1, the input signal "in" and the control signal "a" change from high (for example, the supply voltage Vcc) to low (for example, ground level), and the control signal "b" changes from low to Vcc+α, where α is a gate threshold voltage of the source follower 32, for example, and a voltage increase to turn on the source follower 32. At t2, a gate voltage G of the source follower 32 changes from low to Vcc+α. The source follower 32 is thereby turned on to output an output voltage Vo, which is close to the supply voltage Vcc, through its source. The capacitor 36 is charged with the output voltage Vo via an auxiliary diode connected to the nMOS 34a. The control signal "c" is thereby at the output voltage Vo. The nMOS 37 is off.

At t3, the input signal "in" and the control signal "a" change from low to high (the supply voltage Vcc), and the side of the gate control circuit 31 outputting the control signal "b" is at high impedance. The control signal "c" is at a level where the output voltage Vo is added to the control signal "a". The nMOS 37 is thereby turned on, and the gate of the source follower 32 is discharged through the nMOS 37. At t4, after a delay time td from t3, when the gate voltage G decreases to the same level as the supply voltage Vcc, the output voltage Vo starts decreasing. Then, at t5 when the output voltage Vo reaches a level of the supply voltage Vcc minus the gate threshold voltage h of the nMOS 34a, the nMOS 34a 4 is turned on. The nMOS 37 is thereby turned off, which stops the discharge through the nMOS 37. At the same time, when the output voltage Vo reaches a level of the control signal "a" minus the gate threshold voltage h of the nMOS 39E, the nMOS 39E is turned on. The gate of the source follower 32 is thereby discharged through the current limiter 38 and the nMOS 39E. This discharge is performed more gradually than the discharge through the nMOS 37. At t6, the discharge is completed and the gate voltage G decrease to low, and the output voltage Vo thereby becomes low. An output current Io changes in the same way as the output voltage Vo.

Figure 9:
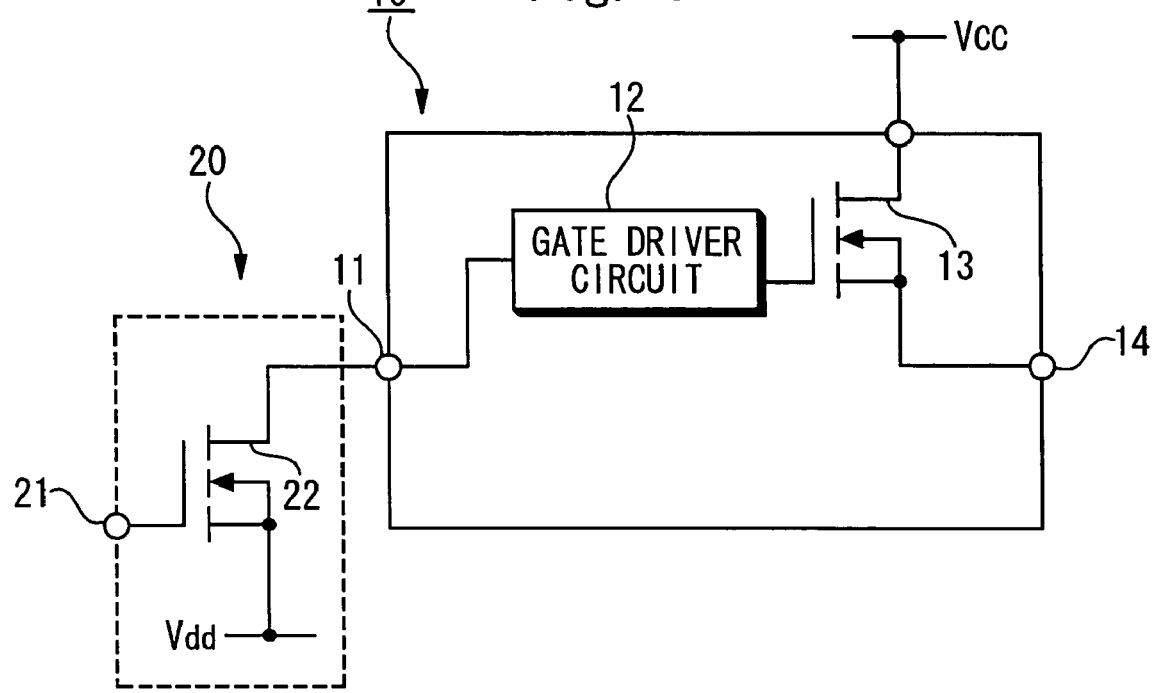
FIG. 9 is a block diagram showing another conventional power switch for car.

As described above, in the first embodiment, when the output voltage Vo is at substantially the same level as the supply voltage Vcc, the nMOS 37 discharges the gate of the source follower 32 based on the turn-off signal (control signal "c") to turn the source follower 32 from on to off. After that, when the output voltage Vo decreases to a level lower than the supply voltage Vcc by the amount of the gate threshold voltage h of the nMOS 34a and 39E, the nMOS 34a is turned on and the nMOS 37 is tuned off. At this time, the nMOS 39E is turned on to discharge the gate of the source follower 32 more gradually than the nMOS 37 does. Thus, a delay time td from input of the turn-off signal (control signal "a") to a change in the output voltage Vo is shortened. Further, since the sources of the nMOS 37 and 39E are connected to the source of the source follower 32, the ground voltage (the second supply voltage) is not needed when discharging the gate of the source follower 32. The output circuit of this embodiment is thereby applicable to a power switch having the configuration shown in FIG. 9.

In the first embodiment, the gate threshold voltage of the nMOS 39E is set equal to or lower than the gate threshold voltage of the nMOS 34a. Without this setting, the discharge of the gate of the source follower 32 can be discontinued for the moment since the nMOS 39E is off when the nMOS 37 is turned off at t5. The undesirable discontinuation of the discharge can be avoided by replacing the nMOS 39E by a depression nMOS. This case is described below as a second embodiment.

Embodiment 2

Figure 3:
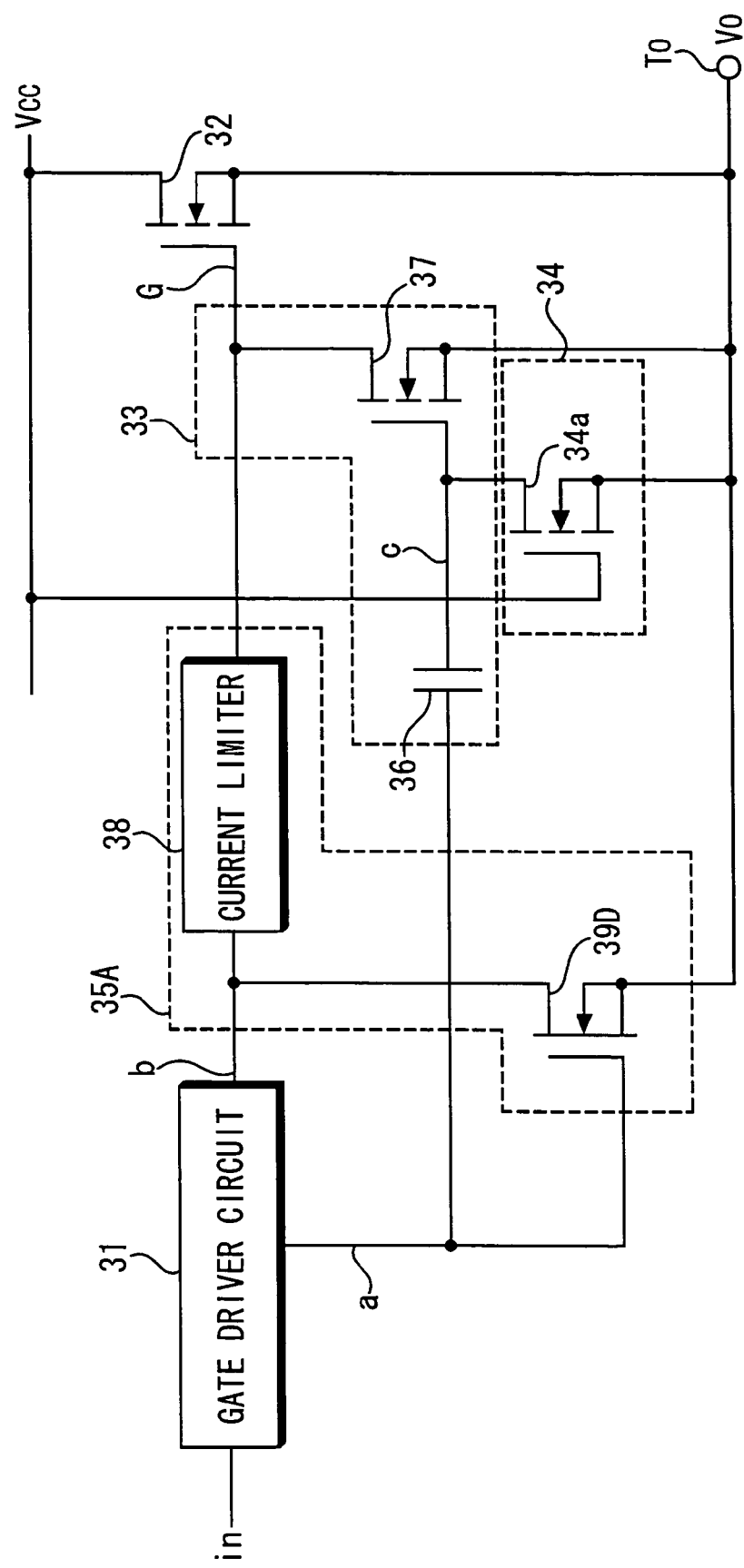
FIG. 3 is a circuit diagram showing an electric configuration of an output circuit according to the second embodiment of the invention.

FIG. 3 is a circuit diagram showing an electric configuration of an output circuit according to the second embodiment of the invention. The same elements as in FIG. 1 showing the first embodiment are denoted by the same reference symbols.

In this output circuit, the discharge circuit 35 in FIG. 1 is replaced by a discharge circuit 35A having a different configuration, as shown in FIG. 3. The discharge circuit 35A has a nMOS 39D instead of the nMOS 39E in FIG. 1. The nMOS 39D is a depression type and turned on when the turn-off signal (control signal "a") is in active mode or at high level. The output circuit of this embodiment is the same as that of FIG. 1 except for the above.

The operation of the output circuit of this embodiment is different from that of the first embodiment in the following way.

At t3 in FIG. 2, when the control signal "a" changes form low to high, the nMOS 39D is turned on. Thus, when nMOS 37 is turned off at t5, the discharge of the gate of the source follower 32 is already started through the nMOS 39D. This prevents undesirable discontinuation of the discharge.

As described above, since the nMOS 39D is turned on at t3 in this embodiment, it has an advantage of avoiding undesirable discontinuation of the discharge of the gate of the source follower 32, in addition to the advantages of the first embodiment.

In the first and second embodiments, the voltage between the gate and source of the nMOS 39E in FIG. 1 or the nMOS 39D in FIG. 3 becomes large after t5. The output voltage Vo thereby drops sharply, which can cause noise on the supply voltage Vcc. The noise can be avoided by reducing the output voltage Vo relatively gradually. This case is shown below as a third embodiment.

Embodiment 3

Figure 4:
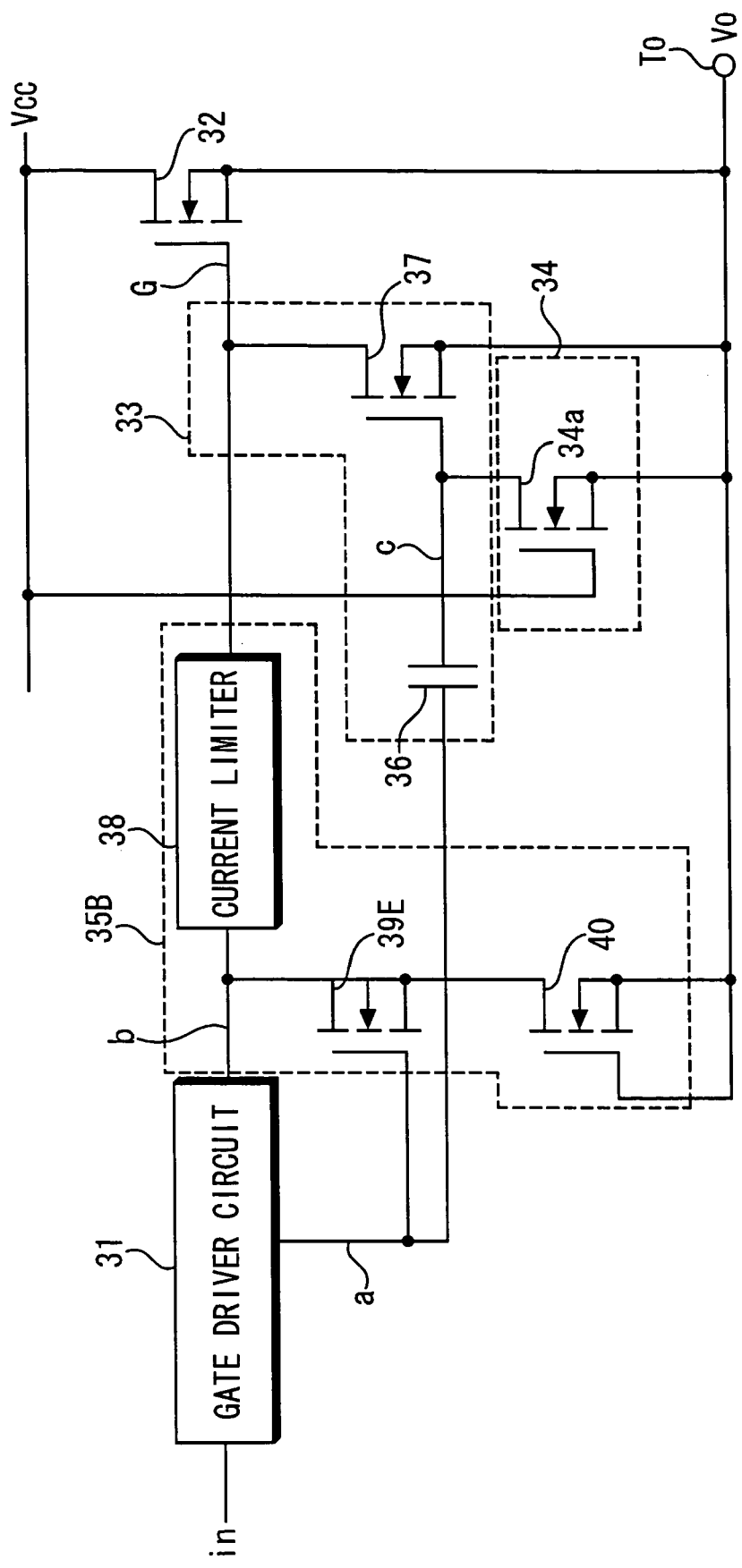
FIG. 4 is a circuit diagram showing an electric configuration of an output circuit according to the third embodiment of the invention.

FIG. 4 is a circuit diagram showing an electric configuration of an output circuit according to the third embodiment of the invention. The same elements as in FIG. 3 showing the second embodiment are denoted by the same reference symbols.

In this output circuit, the discharge circuit 35A in FIG. 3 is replaced by a discharge circuit 35B having a different configuration, as shown in FIG. 4. The discharge circuit 35B has a nMOS 40 between the source of the nMOS 39D of FIG. 3 and the source of the source follower 32. The nMOS 40 is depression type. The gate and source of the nMOS 40 are connected to each other, constituting a constant current device. The output circuit of this embodiment is the same as that of FIG. 3 except for the above.

The operation of the output circuit is different from that of the output circuit of the second embodiment in the following way.

Figure 5:
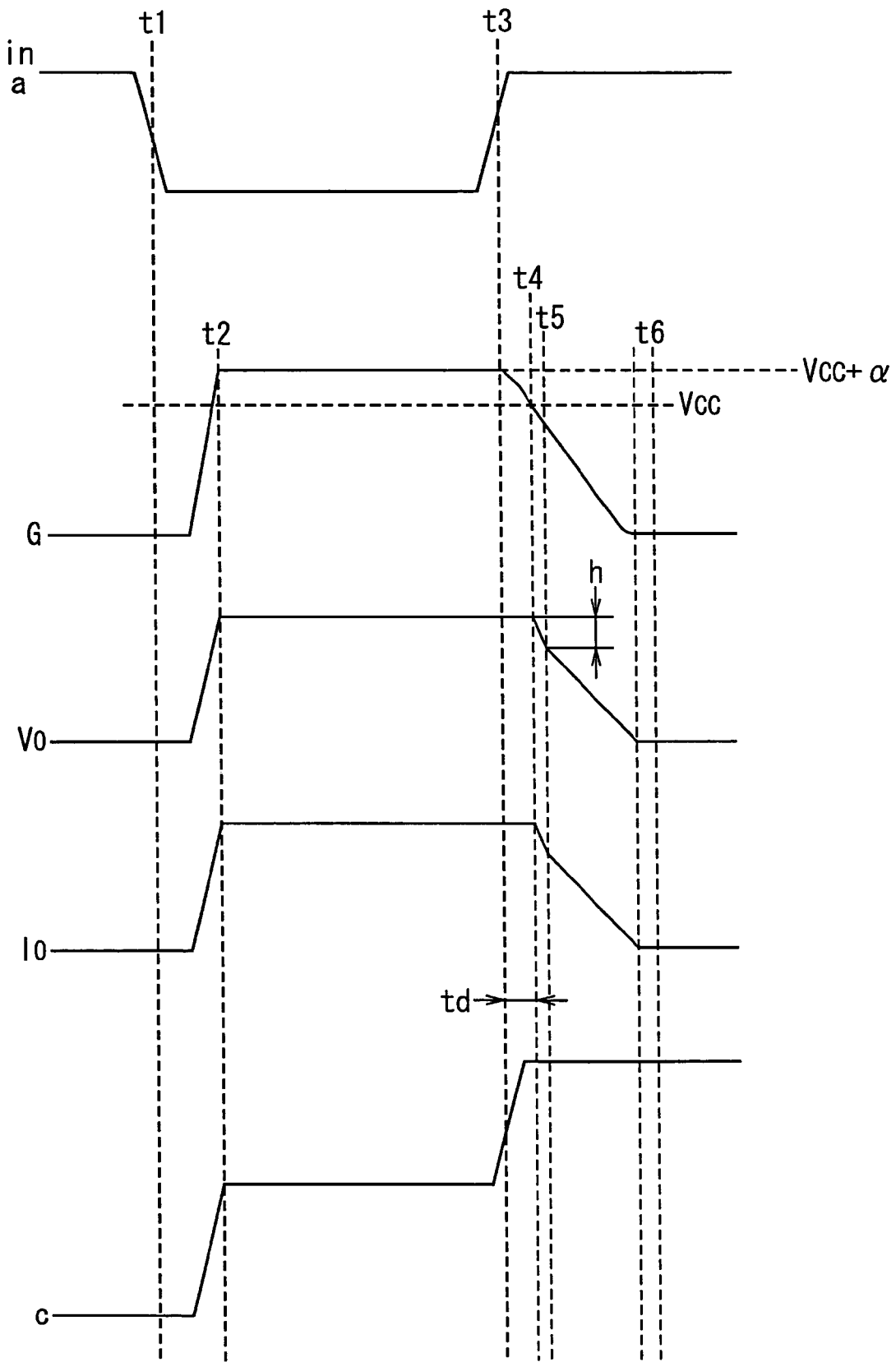
FIG. 5 is a time chart to explain the operation of the output circuit of FIG. 4.
Figure 6:
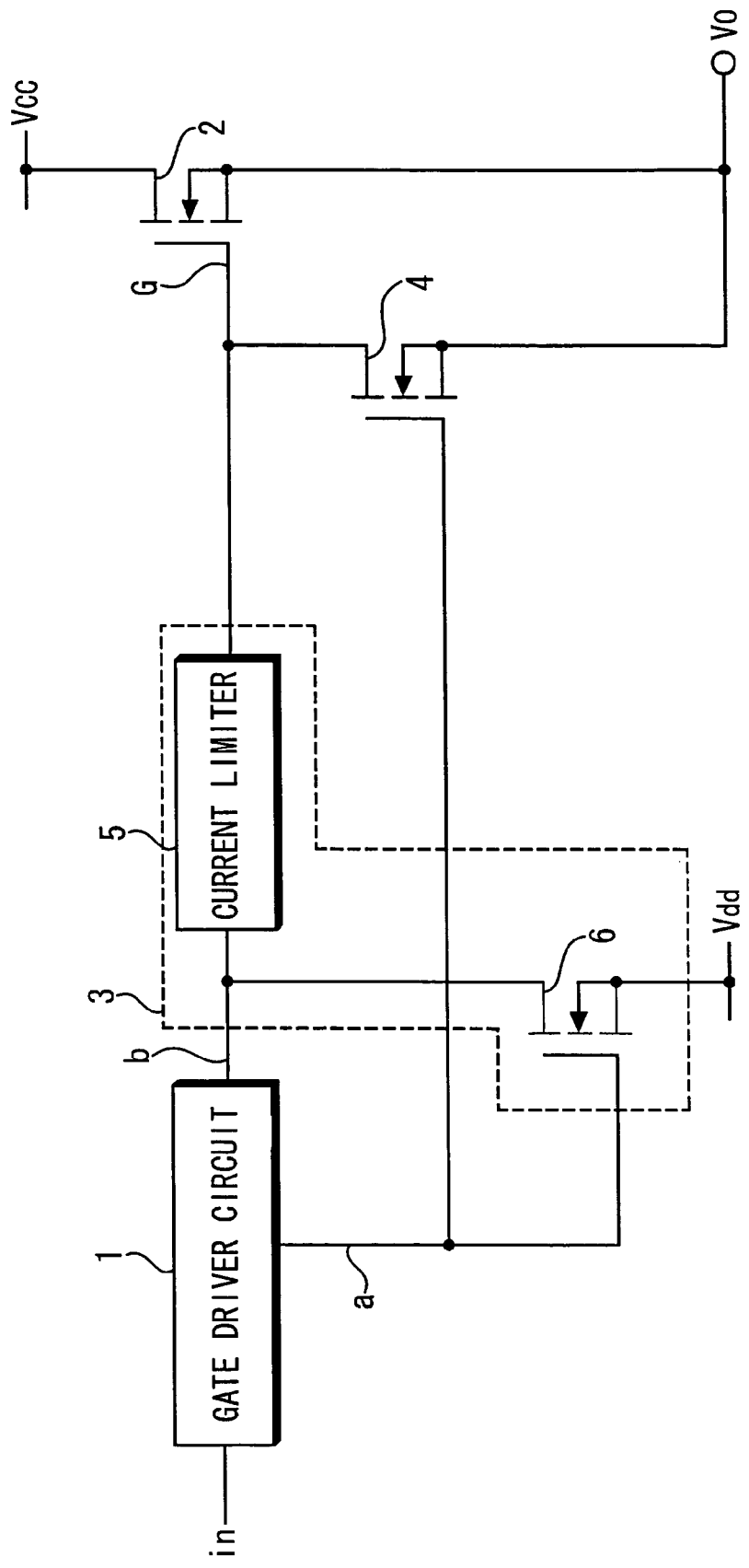
FIG. 6 is a circuit diagram showing an electric configuration of a conventional output circuit.
Figure 7:
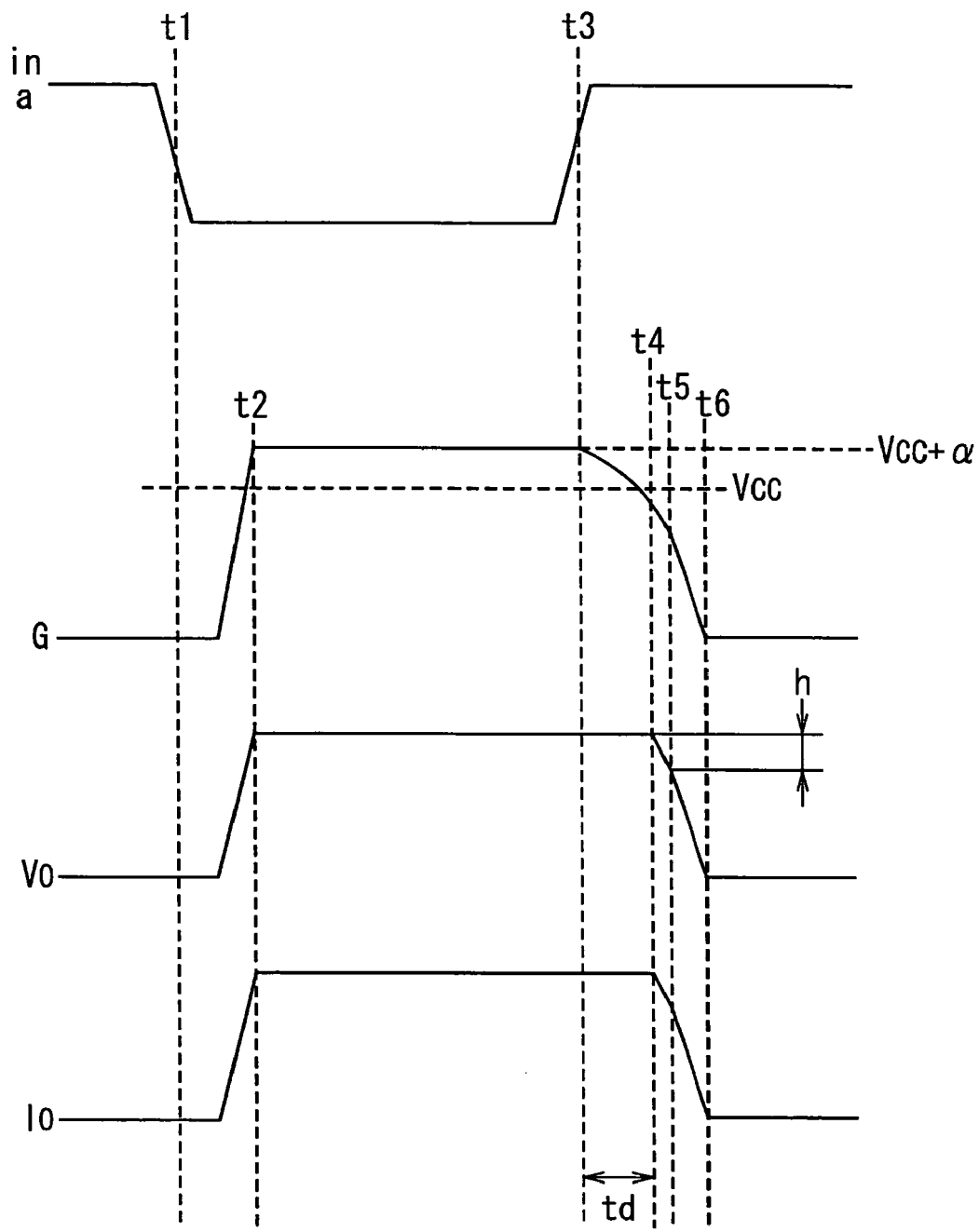
FIG. 7 is a time chart to explain the operation of the output circuit of FIG. 6.
Figure 8:
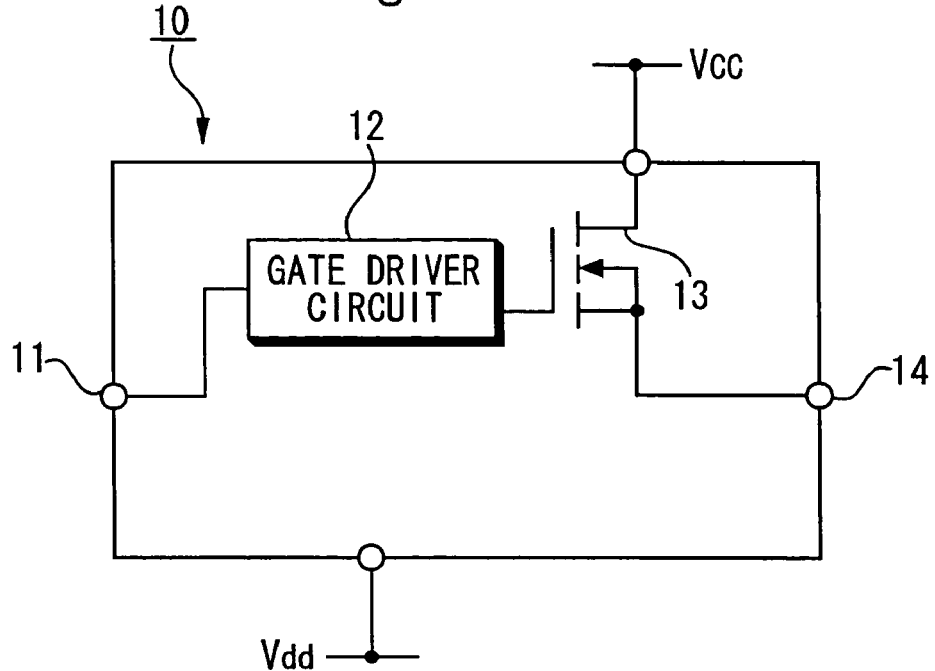
FIG. 8 is a block diagram showing a conventional power switch for car.

As shown in FIG. 5, even if the voltage between the gate and source of the nMOS 39D become large after t5, the gate of the source follower 32 is discharged at a constant current by the nMOS 40, and the output voltage Vo decreases linearly and relatively gradually. Thus, the output voltage Vo does not drop sharply, thereby preventing noise from occurring on the supply voltage Vcc.

As described above, in the third embodiment, the discharge of the gate of the source follower 32 is always performed at a constant current by the nMOS 40, allowing the output voltage Vo to decrease relatively gradually. The third embodiment thus has an advantage of avoiding sharp drop of the output voltage Vo to avoid noise on the supply voltage Vcc, in addition to the advantages of the first and second embodiments.

In the following, preferred embodiments of the present invention are described in detail with reference to the drawings. However, a specific circuit configuration is not limited to these embodiments. For example, though the gate threshold voltage of the nMOS 39E of FIG. 1 is set to the same as the gate threshold voltage of the nMOS 34a, they are not necessarily the same. The discontinuation of the gate of the source follower 32 does not happen as long as the gate threshold voltage of the nMOS 39E does not exceed the gate threshold voltage of the nMOS 34a. Further, the current limiter 38 is not necessarily constituted by a resistor, but may be constituted by a constant current device where the gate and source of a depression nMOS are connected to each other. Furthermore, the output circuit of the third embodiment shown in FIG. 4 may not have the current limiter 38 since it has the constant current device constituted by the nMOS 40. Although the above embodiments describe a single output circuit, it is possible to combine a plurality of (four, for example) output circuits to constitute a bridge circuit, which provides almost the same advantages. Though the side of the gate driver circuit 31 outputting the control signal "b" is connected to the gate of the source follower 32 via the current limiter 38 in FIGS. 1, 3, and 4, it maybe connected there via another resistor, not shown, and so on. This resistor sets an appropriate time constant during the charge of the gate by combined with a capacitor of the gate of the source follower 32.

It is apparent that the present invention is not limited to the above embodiment, that may be modified and changed without departing from the scope and spirit of the invention.

What is claimed is:

1. An output circuit comprising:
   a source follower constituted by a n-channel MOS transistor, having a drain connected to a power source and a source connected to an output terminal, and applying an output voltage to a load through the output terminal when a gate is charged according to an inputted turn-on signal;
   a voltage detector determining if the output voltage is at a first voltage level substantially the same as a voltage level of the power source or at a second voltage level lower than the first voltage level;
   a first discharge circuit discharging the gate of the source follower according to an inputted turn-off signal when the output voltage is at the first voltage level, and stopping discharging the gate of the source follower when the output voltage decreases from the first voltage level to the second voltage level; and
   a second discharge circuit discharging the gate of the source follower more gradually than the first discharge circuit does according to the turn-off signal when the output voltage decreases from the first voltage level to the second voltage level.

2. An output circuit according to claim 1, wherein the first discharge circuit is constituted by a bootstrap circuit which starts discharge of the gate of the source follower earlier than the second discharge circuit does.

3. An output circuit according to claim 1, wherein the first and second discharge circuits are connected between the gate and the source of the source follower.

4. An output circuit according to claim 2, wherein the first and second discharge circuits are connected between the gate and the source of the source follower.

5. An output circuit according to claim 1, wherein the second discharge circuit comprises a current limiter which limits a current when discharging the gate of the source follower.

6. An output circuit according to claim 2, wherein the second discharge circuit comprises a current limiter which limits a current when discharging the gate of the source follower.

7. An output circuit according to claim 3, wherein the second discharge circuit comprises a current limiter which limits a current when discharging the gate of the source follower.

8. An output circuit according to claim 1, wherein the second discharge circuit comprises a depression n-channel MOS transistor which is turned on according to the turn-off signal.

9. An output circuit according to claim 2, wherein the second discharge circuit comprises a depression n-channel MOS transistor which is turned on according to the turn-off signal.

10. An output circuit according to claim 3, wherein the second discharge circuit comprises a depression n-channel MOS transistor which is turned on according to the turn-off signal.

11. An output circuit according to claim 5, wherein the current limiter is constituted by a constant current device.

* * * * *